United States Patent
Ishidai

(10) Patent No.: US 7,270,938 B2
(45) Date of Patent: Sep. 18, 2007

(54) PHOTOPOLYMERIZABLE COMPOSITION, LIGHT SENSITIVE PLANOGRAPHIC PRINTING PLATE MATERIAL AND MANUFACTURING METHOD OF PLANOGRAPHIC PRINTING PLATE

(75) Inventor: Keiko Ishidai, Hachioji (JP)

(73) Assignee: Konica Minolta Medical & Graphic, Inc., Tokyo (JP)

( * ) Notice: Subject to any disclaimer, the term of this patent is extended or adjusted under 35 U.S.C. 154(b) by 24 days.

(21) Appl. No.: 11/322,375

(22) Filed: Jan. 3, 2006

(65) Prior Publication Data

US 2006/0147840 A1    Jul. 6, 2006

(30) Foreign Application Priority Data

Jan. 6, 2005    (JP) .............................. 2005-001260

(51) Int. Cl.
*G03F 7/028*    (2006.01)
(52) U.S. Cl. ................. 430/281.1; 430/286.1; 430/288.1; 430/302; 430/494; 430/944; 430/964
(58) Field of Classification Search ............ 430/270.1, 430/281.1, 286.1, 288.1, 302, 494, 945, 964
See application file for complete search history.

(56) References Cited

U.S. PATENT DOCUMENTS 5,738,974 A * 4/1998 Nagasaka et al. ........ 430/278.1
6,010,824 A * 1/2000 Komano et al. ......... 430/281.1
2004/0219459 A1* 11/2004 Hirabayash ................. 430/300

FOREIGN PATENT DOCUMENTS

EP    704 764 A1 *    4/1996
JP    2006-142552    *    6/2006

* cited by examiner

Primary Examiner—Barbara L. Gilliam
(74) Attorney, Agent, or Firm—Finnegan, Henderson, Farabow, Garrett & Dunner, L.L.P.

(57) ABSTRACT

Disclosed is a photopolymerizable composition containing an addition-polymerizable ethylenically unsaturated compound, a photopolymerization initiator, a polymer binder, and a sensitizing dye represented by the following formula (A),

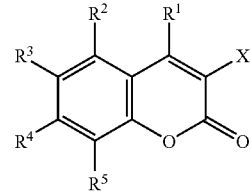

Formula (A)

wherein $R^1$, $R^2$, $R^3$, $R^4$, $R^5$ and X are as defined in the specification.

5 Claims, No Drawings

PHOTOPOLYMERIZABLE COMPOSITION, LIGHT SENSITIVE PLANOGRAPHIC PRINTING PLATE MATERIAL AND MANUFACTURING METHOD OF PLANOGRAPHIC PRINTING PLATE

This application is based on Japanese Patent Application No. 2005-001260, which was respectively filed on Jan. 6, 2005 in Japanese Patent Office, the entire content of which is hereby incorporated by reference.

FIELD OF THE INVENTION

The present invention relates to a photopolymerizable composition, a light sensitive planographic printing plate material (hereinafter also referred to as a planographic printing plate material), and a manufacturing method of a planographic printing plate, and particularly to a light sensitive planographic printing plate material providing high storage stability, high sensitivity and high printing durability, a photopolymerizable composition used in the light sensitive planographic printing plate material, and a method of manufacturing a planographic printing plate from the light sensitive planographic printing plate material.

BACKGROUND OF THE INVENTION

A planographic printing plate material is well known which comprises a support subjected to hydrophilic treatment and provided thereon, a photopolymerizable layer and a protective layer. Recently, a method of manufacturing a planographic printing plate is carried out which subjects a planographic printing plate material to digital exposure employing a laser based on image information, and developing it, whereby a printing plate with an image of high resolution is obtained at high speed without employing an original film. For example, a process of preparing a planographic printing plate is known which comprises scanning-exposing a planographic printing plate material to light modulated by output signals from an electronic plate making system or an image processing system or by image signals transmitted through channel.

It is generally known that the photopolymerizable layer as described above contains an acryl monomer, an alkali-soluble resin, a photopolymerization initiator, and optionally a sensitizing dye to absorb a range of wavelengths of emitted light for exposure (particularly laser light).

As a light source for exposing a photopolymerization type light sensitive planographic printing plate material is used a visible light source having a longer wavelength such as an Ar laser (488 nm) or an FD-YAG laser (532 nm). In recent years, semiconductor lasers employing, for example, InGaN type material, which can continuously emit light with a wavelength of from 380 to 430 nm, are about to be put into practical use. A scanning exposure system employing light with such a short wavelength as a light source has advantages in providing sufficient output power and an economical system, since the semiconductor lasers can be manufactured at low cost. Further, a light sensitive planographic printing plate material to be applied to the above light source has a spectral sensitivity shorter than that of a planographic printing plate material to be applied to a system employing a conventional FD-YAG laser or Ar laser, and therefore provides an excellent safe light property, whereby operation under room light is easy. For the reasons above, a manufacturing method of a planographic printing plate has been strongly desired in this industry, which employs a relatively short wavelength semiconductor laser with a wavelength of from 350 to 450 nm.

Ketocoumarin compounds are disclosed in Japanese Patent O.P.I. Publication Nos. 2003-21901 as sensitizing dyes, which are used in a photopolymerizable composition having high sensitivity to a short wavelength semiconductor laser with a wavelength of 350 to 450 nm. However, these ketocoumarin compounds have problems in that sensitivity is insufficient and sufficient printing durability is not obtained.

SUMMARY OF THE INVENTION

The present invention has been made in view of the above. An object of the invention is to provide a light sensitive planographic printing plate material, which provides high storage stability, high sensitivity and high printing durability, a photopolymerizable composition used in the light sensitive planographic printing plate material, and a method of manufacturing a planographic printing plate from the light sensitive planographic printing plate material.

DETAILED DESCRIPTION OF THE INVENTION

The above object has been achieved by any one of items described below.

1. A photopolymerizable composition containing an addition-polymerizable ethylenically unsaturated compound, a polymer binder, a photopolymerization initiator, and a sensitizing dye represented by the following formula (A),

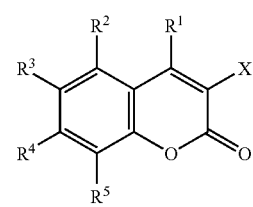

Formula (A)

wherein $R^1$, $R^2$, $R^3$, $R^4$, and $R^5$ independently represent a hydrogen atom or a substituent; and X represents a substituted or unsubstituted 6-member aromatic ring group, provided that the aromatic ring may form a condensed ring together with another ring.

2. The photopolymerizable composition of item 1 above, wherein $R^4$ in formula (A) represents a dialkylamino group.

3. The photopolymerizable composition of item 1 above, the 6-member aromatic ring group having a first atom combining with the coumarin nucleus and two second atoms positioned adjacent to the first atom, wherein at least one of the two second atoms is a nitrogen atom.

4. The photopolymerizable composition of item 1 above, wherein the photopolymerization initiator is an iron arene complex or a titanocene compound.

5. A light sensitive planographic printing plate material comprising a support, and provided thereon, a photopolymerizable light sensitive layer comprising the photopolymerizable composition of item 1 above.

6. A process of manufacturing a planographic printing plate comprising the step of imagewise scanning-exposing the light sensitive planographic printing plate material of item 5 above to laser beams with a wavelength of from 350 to 450 nm.

Preferred embodiment of the invention will be detailed below, but the invention is not limited thereto.

The sensitizing dye represented by formula (A) will be explained.

In formula (A), $R^1$, $R^2$, $R^3$, $R^4$, and $R^5$ independently represent a hydrogen atom or a substituent. Examples of the substituent include an alkyl group (e.g., methyl, ethyl, propyl, isopropyl, tert-butyl, pentyl, hexyl, octyl, dodecyl, tridecyl, tetradecyl, pentadecyl), a cycloalkyl group (e.g., cyclopentyl, cyclohexyl), an alkenyl group (e.g., vinyl, allyl), an alkynyl group (e.g., ethynyl, propargyl), an aryl group (e.g., phenyl, naphthyl), a heterocyclic group (e.g., furyl, thienyl, pyridyl, pyridazyl, pyrimidyl, pyrazyl, triazyl, imidazolyl, pyrazolyl, thiazolyl, benzimidazolyl, benzoxazolyl, quinazolyl, phthalazyl, pyrrolidyl, imidazolidyl, morpholyl group, oxazolidyl), an alkoxy group (e.g., methoxy, ethoxy, propyloxy, pentyloxy, hexyloxy, octyloxy, dodecyloxy), a cycloalkoxy group (e.g., cyclopentyloxy, cyclohexyloxy), an aryloxy group (e.g., phenoxy, naphthyloxy), an alkylthio group (e.g., methylthio, ethylthio, propylthio, pentylthio, hexylthio, octylthio, dodecylthio), a cycloalkylthio group (e.g., cyclopentylthio, cyclohexylthio), an arylthio group (e.g., phenylthio, naphthylthio), an alkoxycarbonyl group (e.g., methyloxycarbonyl, ethyloxycarbonyl, butyloxycarbonyl, octyloxycarbonyl, dodecyloxycarbonyl), an aryloxycarbonyl group (e.g., phenyloxycarbonyl, naphthyloxycarbonyl), a sulfamoyl group (e.g., aminosulfonyl, methylaminosulfonyl, dimethylaminosulfonyl, butylaminosulfonyl, hexylaminosufonyl, cyclohexylaminosulfonyl, octylaminosulfonyl, dodecylaminosulfonyl, phenylaminosulfonyl, naphthylaminosulfonyl, 2-pyridylaminosulfonyl), an acyl group (e.g., acetyl, ethylcarbonyl, propylcarbonyl, pentylcarbonyl, cyclohexylcarbonyl, octylcarbonyl, 2-ethylhexylcarbonyl, dodecylcarbonyl, phenylcarbonyl, naphthylcarbonyl, pyridylcarbonyl), an acyloxy group (e.g., acetyloxy, ethylcarbonyloxy, butylcarbonyloxy, octylcarbonyloxy, dodecylcarbonyloxy, phenylcarbonyloxy), an amido group (e.g., methylcarbonylamino, ethylcarbonylamino, dimethylcarbonylamino, propylcarbonylamino, pentylcarbonylamino, cyclohexylcarbonylamino, 2-ethylhexylcarbonylamino, octylcarbonylamino, dodecylcarbonylamino, phenylcarbonylamino, naphthylcarbonylamino), a carbamoyl group (e.g., aminocarbony, methylaminocarbonyl, dimethylaminocarbonyl, propylaminocarbonyl, pentylaminocarbonyl, cyclohexylaminocarbonyl, octylaminocarbonyl, 2-ethylhexylaminocarbonyl, dodecylaminocarbonyl, phenylaminocarbonyl, naphthylaminocarbonyl, 2-pyridylaminocarbonyl), a ureido group (e.g., methylureido, ethylureido, pentylureido, cyclohexylureido, octylureido, dodecylureido, phenylureido, naphthylureido, 2-pyridylureido), a sufinyl group (e.g., methylsulfinyl, ethylsulfinyl, butylsulfinyl, cyclohexylsulfinyl, 2-ethylhexylsulfinyl, dodecysulfinyl, phenylsufinyl, naphthylsulfinyl, 2-pyridylsulfiny), an alkylsulfonyl group (e.g., methylsulfonyl, ethylsulfonyl, butylsulfonyl, cyclohexylsulfonyl, 2-ethylhexylsulfonyl, dodecylsufonyl), an arylsulfonyl group (e.g., phenylsulfonyl, naphthylsulfonyl, 2-pyridylsulfonyl), an amino group (e.g., amino, ethylamino, dimethylamino, butylamino, cyclopentylamino, 2-ethylhexylamino, dodecylamino, anilino, naphthylamino, 2-pyridylamino), a halogen atom (e.g., fluorine atom, chlorine atom, bromine atom), a fluorohydrocarbon group (e.g., fluoromethyl, trifluoromethyl, pentafluoroethyl, pentafluorophenyl), a cyano group, a nitro group, a hydroxyl group, a mercapto group, and a silyl group (e.g., trimethylsilyl, triisopropylsilyl, triphenylsilyl, phenyldiethylsilyl). The foregoing substituents may have the substituent as denoted above in $R^1$ through $R^5$, and the plural substituents described above adjacent to each other may combine with each other to form a ring.

X represents a 6-member aromatic group. Examples of the 6-member aromatic group include a phenyl group, a pyridyl group, a pyridazinyl group, a pyrimidinyl group, and a pyrazinyl group. The 6-member aromatic group may be condensed with another ring to form a condensed ring. Examples of the ring for forming the condensed ring include a benzene ring, a pyridine ring, a quinoline ring, a pyridazine ring, a pyrimidine ring, a pyrazine ring, a triazine ring, an imidazole ring, and a tetrazole ring. The 6-member aromatic group and the condensed ring may have a substituent. Examples of the substituent include those as denoted in $R^1$ through $R^5$ above.

In formula (A), the 6 member aromatic group of X is preferably a 6 member aromatic group which at least one of atoms adjacent to the bonding position is a nitrogen atom. R4 is preferably a dialkylamino group, provided that the alkyl may have a substituent. The substituent, which the alkyl of the alkylamino group may have, is the same as denoted in $R^1$ through $R^5$ above. One or two of the alkyl groups of the dialkyl in the dialkylamino group of $R^4$ may combine with the adjacent $R^3$ and/or $R^5$ to form a ring.

Typical examples of the sensitizing dye represented by formula (A) will be listed below, but the invention is not limited thereto.

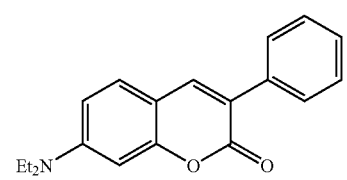

A01

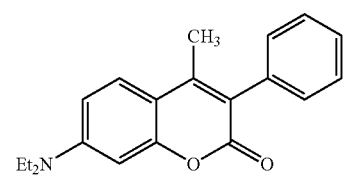

A02

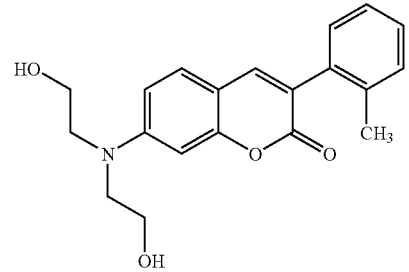

A03

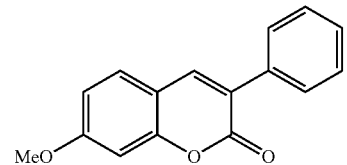

A04

-continued
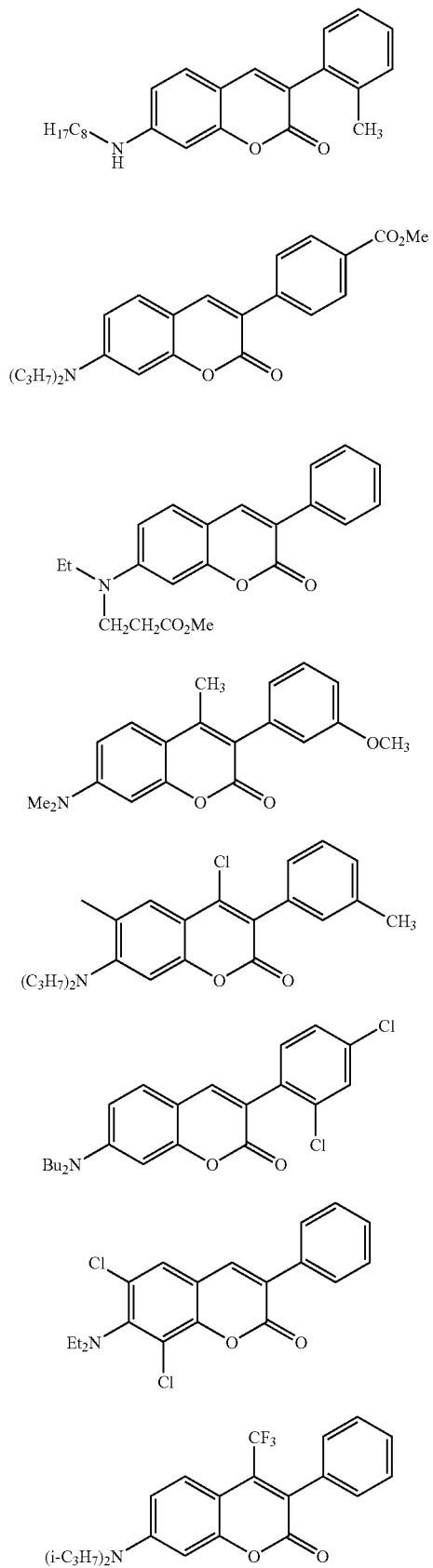
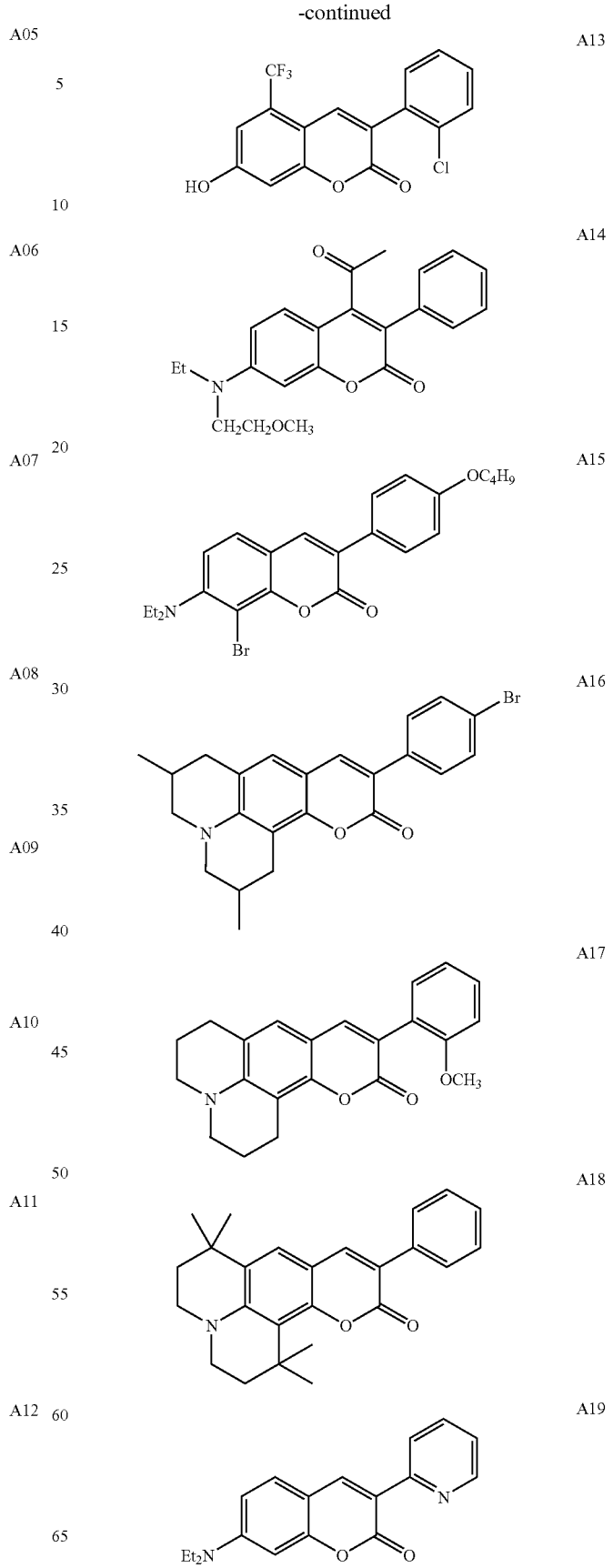

-continued
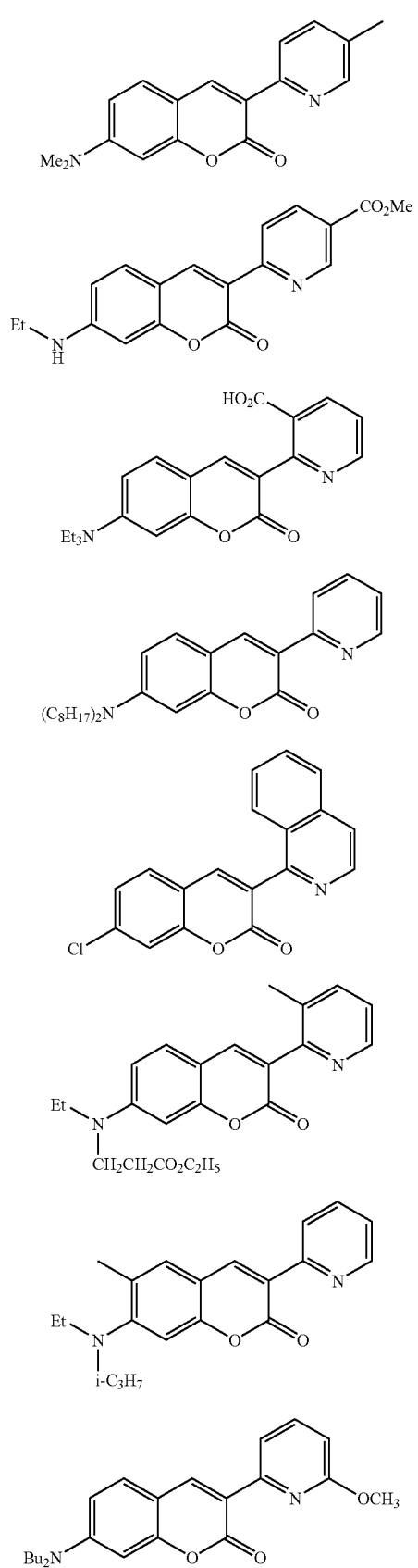
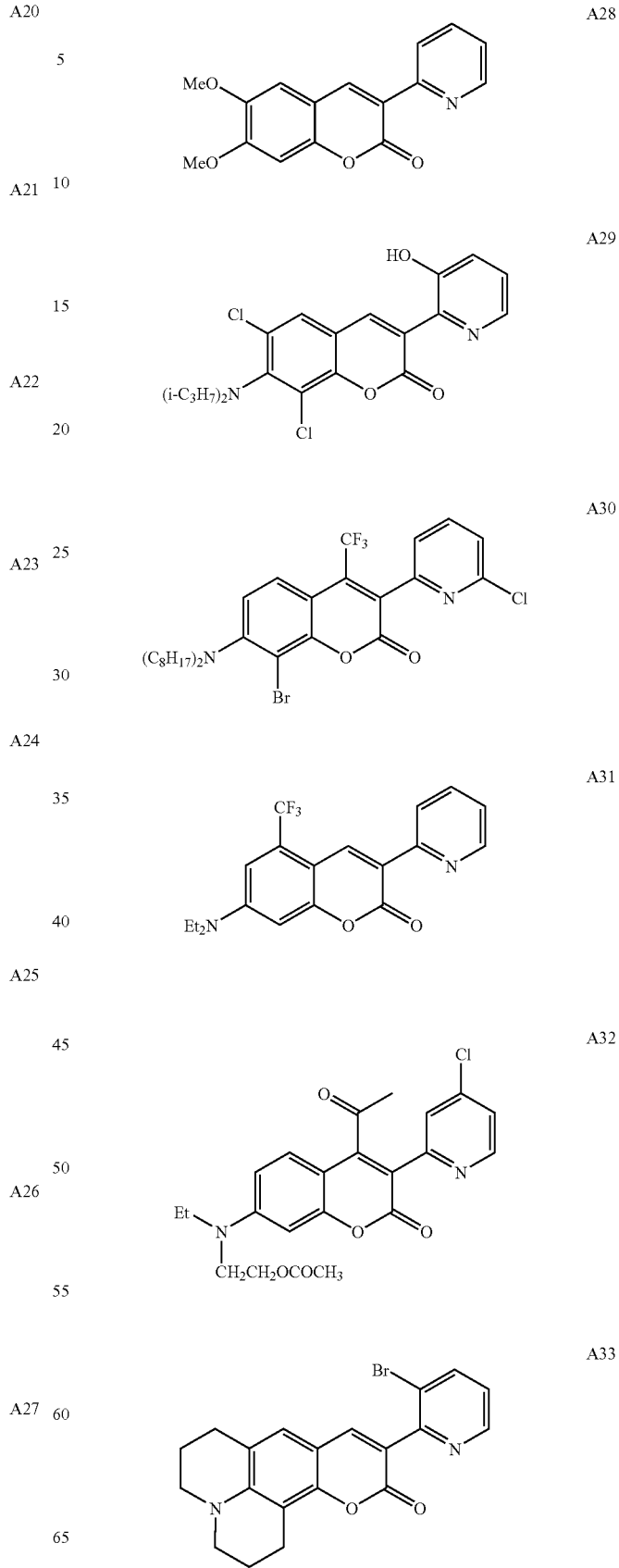

-continued
A34
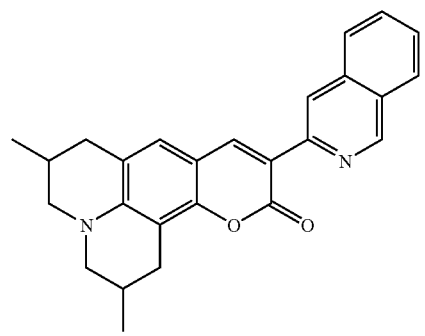
A35
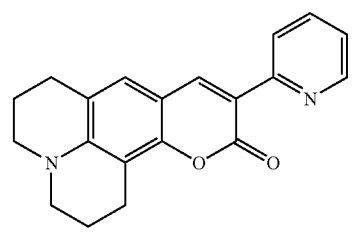
A36
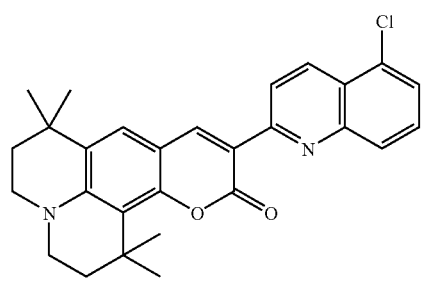
A37
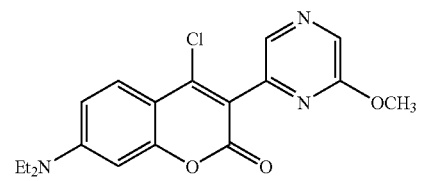
A38
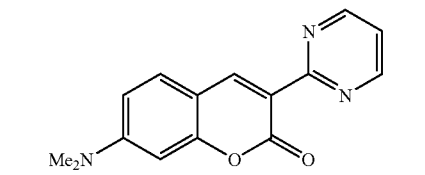
A39
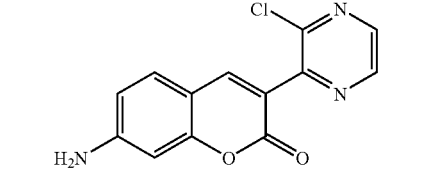
A40
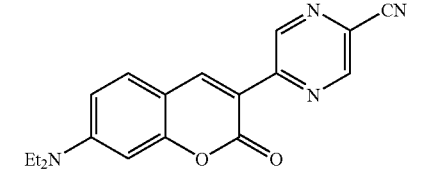
-continued
A41
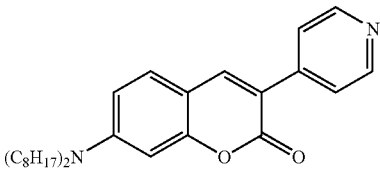
A42
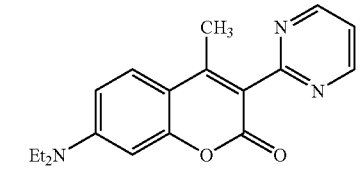
A43
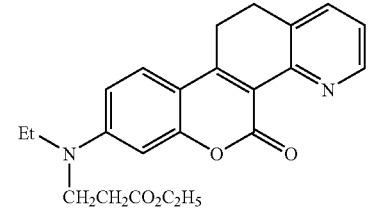
A44
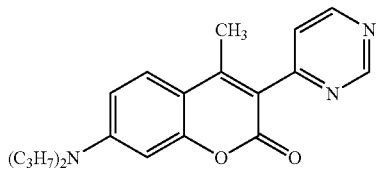
A45
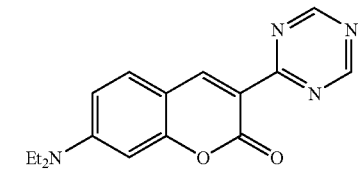
A46
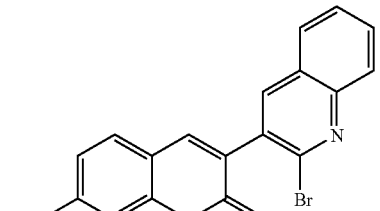
A47
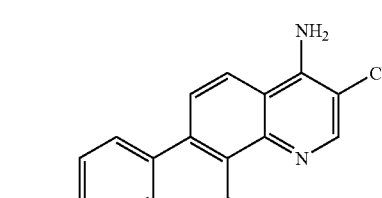
A48
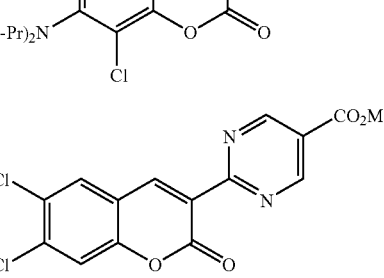

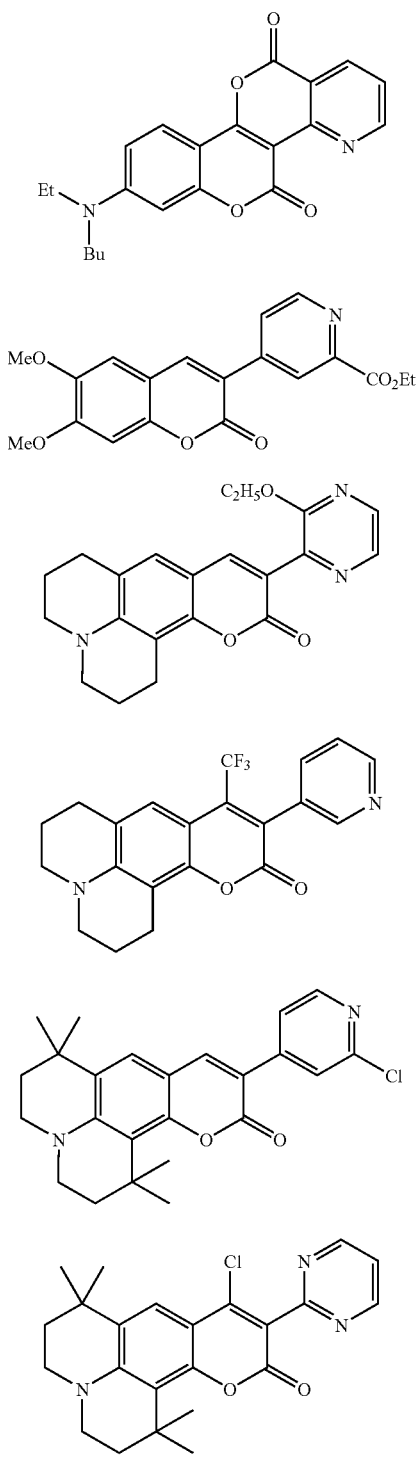

The sensitizing dyes can be used singly or as an admixture of two or more kinds thereof.

Examples of the photopolymerization initiator include halide compounds (e.g., α-haloacetophenones, trichloromethyltriazines); azo compounds, aromatic carbonyl compounds (e.g., benzoine esters, ketals, acetophenones, o-acyloxyiminoketones, acylphosphine oxides); hexaarylbisimidazole compounds; peroxides; iron-arene complexes; and titanocene compounds.

As the peroxides, the organic peroxides disclosed in Japanese Patent O.P.I. Publication Nos. 59-1504 and 61-240807 can be used. Typical examples of the peroxides include ketone peroxides such as methylethyl ketone peroxide, methylisobutyl ketone peroxide, cyclohexanone peroxide, methylcyclohexanone peroxide and 3,3,5-trimethylcyclohexanone peroxide, diacyl peroxides such as acetylperoxide, propionylperoxide, isobutylperoxide, octanoylperoxide, 3,5,5-trimethylhexanoylperoxide, decanoylperoxide, lauroylperoxide, benzoylperoxide, p-chlorobenzoylperoxide, 2,4-dichlorobenzoylperoxide and acetylcyclohexanesulfonylperoxide, hydroperoxides such as tert-butylhydroperoxide, cumenehydroperoxide, diisopropylbenzene hydroperoxide, p-methanehdroperoxide, 2,5-dimethylhexane-2,5-dihydroperoxide and 1,1,3,3-tetramethylbutyl hydroperoxide, peroxyketals such as di-tert-butylperoxide, tert-butylcumylperoxide, 1,3-bis(tert-butylperoxyisopropyl) benzene, 2,5-di(tert-butylperoxy)-1, 3,5-trimethylcyclohexane and n-butyl-4,4'-bis(tert-butylperoxy)butane, alkylperesters such as tert-butylperoxyacetate, tert-butylperoxyisobutylate, tert-butylperoxyoctate, tert-butylperoxypivalate, tert-butylperoxyneodecanate, tert-butylperoxy-3,5,5-trimethylhexanoate, tert-butylperoxybenzoate, di-tert-butylperoxyphthalate, di-tert-butylperoxyisophthalate, tert-butylperoxylaurate and 2,5-dimethyl-2,5-dibenzoylperoxyhexane, peroxycarbonates such as di-2-ethylhexylperoxydicarbonate, di-isopropylperoxydicarbonate, di-sec-butylperoxycarbonate, di-propylperoxydicarbonate, dimethoxy-isopropylperoxydicarbonate, di-3-methoxybutylperoxydicarbonate, di-ethoxyethyl-peroxydicarbonate, and bis-(4-tert-butylcyclohexyl)-peroxydicarbonate, and water soluble peroxides such as succinic acid peroxide.

As a preferred peroxide, there is an organic peroxide represented by the following formula:

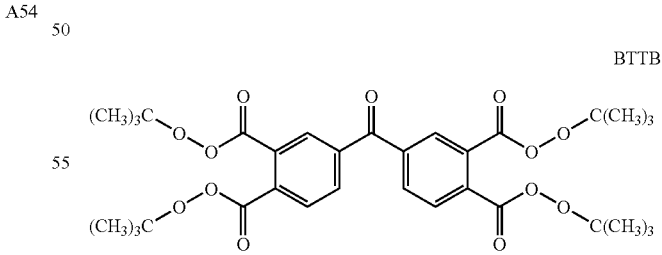

BTTB

The iron arene complex preferably used in the invention refers to a compound in which an iron ion combines with π electron of an aromatic hydrocarbon compound, an aromatic heterocyclic compound or an unsaturated compound through a π bonding. The iron arene complex is not specifically limited, and examples thereof include compounds having the the following structure.

The sensitizing dye in the invention can be easily synthesized according to a conventional synthetic method.

The addition amount of the sensitizing dye in the invention in the photopolymerizable composition is ordinarily from 0.05 to 30 parts by weight, and preferably from 0.1 to 20 parts by weight, based on 100 parts by weight of ethylenically unsaturated compound described later.

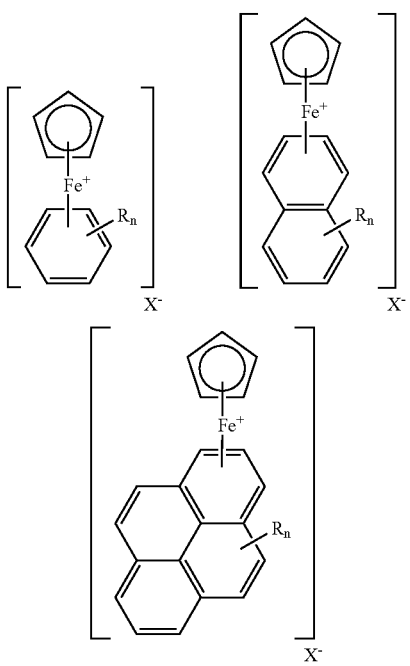

The titanocene compound preferably used in the invention is not specifically limited, but those disclosed in Japanese Patent O.P.I. Publication Nos. 59-152396 and 61-151197 can be cited. Typical examples of the titanocene compound include di-cyclopentadienyl-Ti-dichloride, di-cyclopentadienyl-Ti-bisphenyl, di-cyclopentadienyl-Ti-bis-2,3,4,5,6-pentafluorophenyl-1-yl, di-cyclopentadienyl-Ti-bis-2,3,5,6-tetrafluorophenyl-1-yl, di-cyclopentadienyl-Ti-bis-2,4,6-trifluorophenyl-1-yl, di-cyclopentadienyl-Ti-bis-2,6-difluorophenyl-1-yl, di-cyclopentadienyl-Ti-bis-2,4-difluorophenyl-1-yl, di-methylpentadienyl-Ti-bis-2,3,4,5,6-pentafluorophenyl-1-yl, di-methylpentadienyl-Ti-bis-2,3,5,6-tetrafluorophenyl-1-yl, di-methylpentadienyl-Ti-bis-2,6-difluorophenyl-1-yl and di-cyclopentadienyl-Ti-bis-2,6-difluoro-3-(pyrrole-1-yl)-phenyl-1-yl (hereinafter referred to as Ti-1). Of these compounds, Ti-1 is especially preferable. Ti-1 is represented by the following formula:

Ti-1

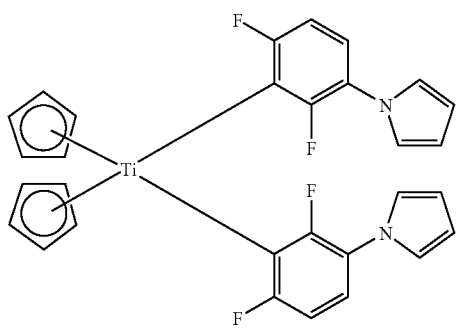

As the photopolymerization initiator, an onium salt such as an iodonium salt, a sulfonium salt, a phosphonium salt and a stannonium salt can be used. The various onium compounds disclosed in Japanese Patent Publication No. 55-39162 and Japanese Patent O.P.I. Publication No. 59-14023 and in Macromolecule, Vol. 10, p. 1307 (1977) can be used. As the iodonium salt, the diaryliodonium salt is preferably used.

Examples of the onium salt include a chloride, bromide, fluoroborate, hexafluoroborate, hexafluorophosphate, hexafluoroarsenate, hexafluoroantimonate, perchlorate, benzenesulfonate, p-toluenesulfonate, p-trifluoromethylbenzene sulfonate or boron butyl triphenyl salt of diphenyliodonium, ditolyliodonium, phenyl(p-methoxyphenyl)iodonium, bis (m-nitrophenyl)iodonium, bis(p-t-butylphenyl)iodonium or bis(p-cyanophenyl)iodonium.

A dimer of 2,4,5-triarylimidazole can be preferably used in the invention. The dimer represented by the following formula disclosed in Japanese Patent O.P.I. Publication Nos. 55-127550 and 60-202437 is preferably used.

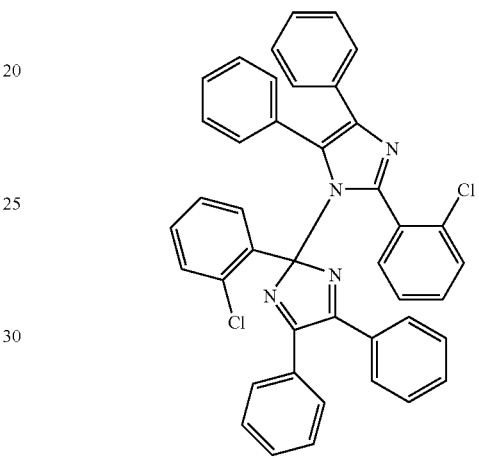

The addition amount of the photopolymerization initiator is preferably 0.1 to 20 parts by weight based on 100 parts by weight of ethylenically unsaturated compound described later, although it is not specifically limited. The content ratio of the photopolymerization initiator to the sensitizing dye in the photopolymerization composition is preferably from 1:100 to 100:1 by mole.

As the addition-polymerizable ethylenically unsaturated compound (hereinafter also referred to as ethylenically unsaturated compound or ethylenically unsaturated monomer) in the invention, there are a conventional radical polymerizable monomer and a polyfunctional monomer or oligomer having two or more of an ethylenic double bond in the molecule as generally used in an ultraviolet curable resin composition.

Such a compound is not specifically limited. Preferred examples thereof include a monofunctional acrylate such as 2-ethylhexyl acrylate, 2-hydroxypropyl acrylate, glycerol acrylate, tetrahydrofurfuryl acrylate, phenoxyethyl acrylate, nonylphenoxyethyl acrylate, tetrahydrofurfuryl-oxyethyl acrylate, tetrahydrofurfuryloxyhexanorideacrylate, an ester of 1,3-dioxane-ϵ-caprolactone adduct with acrylic acid, or 1,3-dioxolane acrylate; a methacrylate, itaconate, crotonate or maleate alternative of the above acrylate; a bifunctional acrylate such as ethylene glycol diacrylate, triethylene glycol diacrylate, pentaerythritol diacrylate, hydroquinone diacrylate, resorcin diacrylate, hexanediol diacrylate, neopentyl glycol diacrylate, tripropylene glycol diacrylate, hydroxypivalic acid neopentyl glycol diacrylate, neopentyl glycol adipate diacrylate, diacrylate of hydroxypivalic acid neopentyl glycol-ϵ-caprolactone adduct, 2-(2-hydroxy-1,1-dimethylethyl)-5-hydroxymethyl-5-ethyl-1,3-dioxane diacrylate, tricyclodecanedimethylol acrylate, tricyclodecanedimethylol acrylate-ε-caprolactone adduct or 1,6-hexanediol diglycidylether diacrylate; a dimethacrylate, diitaconate, dicrotonate or dimaleate alternative of the above diacrylate; a polyfunctional acrylate such as trimethylolpropane triacrylate, ditrimethylolpropane tetraacrylate, trimethylolethane triacrylate, pentaerythritol triacrylate, pentaerythritol tetraacrylate, dipentaerythritol tetraacrylate, dipentaerythritol pentaacrylate, dipentaerythritol hexacrylate, dipentaerythritol hexacrylate-ε-caprolactone adduct, pyrrogallol triacrylate, propionic acid dipentaerythritol triacrylate, propionic acid dipentaerythritol tetraacrylate or hydroxypivalylaldehyde modified dimethylolpropane triacrylate; a methacrylate, itaconate, crotonate or maleate alternative of the above polyfunctional acrylate.

Prepolymers can be used, and the prepolymers can be used singly, in combination, or as an admixture thereof with the above described monomer and/or oligomer.

Examples of the prepolymer include polyester (meth) acrylate obtained by incorporating (meth)acrylic acid in a polyester of a polybasic acid such as adipic acid, trimellitic acid, maleic acid, phthalic acid, terephthalic acid, hymic acid, malonic acid, succinic acid, glutaric acid, itaconic acid, pyromellitic acid, fumalic acid, pimelic acid, sebatic acid, dodecanic acid or tetrahydrophthalic acid with a polyol such as ethylene glycol, ethylene glycol, diethylene glycol, propylene oxide, 1,4-butane diol, triethylene glycol, tetraethylene glycol, polyethylene glycol, grycerin, trimethylol propane, pentaerythritol, sorbitol, 1,6-hexanediol or 1,2,6-hexanetriol; an epoxyacrylate such as bisphenol A•epichlorhydrin•(meth)acrylic acid or phenol novolak•epichlorhydrin•(meth)acrylic acid obtained by incorporating (meth)acrylic acid in an epoxy resin; an urethaneacrylate such as ethylene glycol•adipic acid•tolylenediisocyanate•2-hydroxyethylacrylate, polyethylene glycol•tolylenediisocyanate•2-hydroxyethylacrylate, hydroxyethylphthalyl methacrylate•xylenediisocyanate, 1,2-polybutadieneglycol•tolylenediisocyanate•2-hydroxyethylacrylate or trimethylolpropane•propylene glycol•tolylenediisocyanate•2-hydroxyethylacrylate, obtained by incorporating (meth)acrylic acid in an urethane resin; a silicone acrylate such as polysiloxane acrylate, or polysiloxane•diisocyanate•2-hydroxyethylacrylate; an alkyd modified acrylate obtained by incorporating a methacroyl group in an oil modified alkyd resin; and a spirane resin acrylate.

The photopolymerization composition in the invention may contain a monomer such as a phosphazene monomer, triethylene glycol, an EO modified isocyanuric acid diacrylate, an EO modified isocyanuric acid triacrylate, dimethyloltricyclodecane diacrylate, trimethylolpropane acrylate benzoate, an alkylene glycol acrylate, or a urethane modified acrylate, or an addition-polymerizable oligomer or prepolymer having a structural unit derived from the above monomer.

The ethylenic monomer used in the invention is a phosphate compound having at least one (meth)acryloyl group. The phosphate compound is a compound having a (meth) acryloyl group in which at least one hydroxyl group of phosphoric acid is esterified.

Besides the above compounds, compounds disclosed in Japanese Patent O.P.I. Publication Nos. 58-212994, 61-6649, 62-46688, 62-48589, 62-173295, 62-187092, 63-67189, and 1-244891, compounds described on pages 286 to 294 of "11290 Chemical Compounds" edited by Kagakukogyo Nipposha, and compounds described on pages 11 to 65 of "UV•EB Koka Handbook (Materials)" edited by Kobunshi Kankokai can be suitably used. Of these compounds, compounds having two or more acryl or methacryl groups in the molecule are preferable, and those having a molecular weight of not more than 10,000, and preferably not more than 5,000 are more preferable.

In the invention, an addition-polymerizable ethylenically unsaturated monomer having a tertiary amino group in the molecule is preferably used. Its molecular structure is not limited, but those are preferred in which a tertiary amine having a hydroxyl group is modified with glycidyl methacrylate, methacrylic chloride, or acrylic chloride. Examples thereof include a polymerizable compound disclosed in Japanese Patent O.P.I. Publication Nos. 1-165613, and 1-203413.

A reaction product of (i) a polyhydric alcohol having a tertiary amino group in the molecule, (ii) a diisocyanate, and (iii) a compound having both hydroxyl group and addition polymerizable ethylenically double bond in the molecule is preferably used in the invention.

Examples of the polyhydric alcohol having a tertiary amino group in the molecule include triethanolamine, N-methyldiethanolamine, N-ethyldiethanolamine, N-ethyldiethanolamine, N-n-butyldiethanolamine, N-tert-butyldiethanolamine, N,N-di(hydroxyethyl)aniline, N,N,N',N'-tetra-2-hydroxypropylethylenediamine, p-tolyldiethanolamine, N,N,N',N'-tetra-2-hydroxyethylethylenediamine, N,N-bis(2-hydroxypropyl)aniline, allyldiethanolamine, 3-dimethylamino-1,2-propane diol, 3-diethylamino-1,2-propane diol, N,N-di(n-propylamino)-2,3-propane diol, N,N-di(iso-propylamino)-2,3-propane diol, and 3-(N-methyl-N-benzylamino)-1,2-propane diol.

Examples of the diisocyanate include butane-1,4-diisocyanate, hexane-1,6-diisocyanate, 2-methylpentane-1,5-diisocyanate, octane-1,8-diisocyanate, 1,3-diisocyanatomethylcyclohexanone, 2,2,4-trimethylhexane-1,6-diisocyanate, isophorone diisocyanate, 1,2-phenylene diisocyanate, 1,3-phenylene diisocyanate, 1,4-phenylene diisocyanate, tolylene-2,4-diisocyanate, tolylene-2,5-diisocyanate, tolylene-2,6-diisocyanate, 1,3-di(isocyanatomethyl)benzene, and 1,3-bis(1-isocyanato-1-methylethyl)benzene, but the invention is not specifically limited thereto.

Examples of the compound having in the molecule a hydroxyl group and an addition polymerizable ethylenically double bond include compounds MH-1 through MH-13 as shown below, but the invention is not limited thereto.

The chemical structure of MH-1 through MH-13 will be shown below.

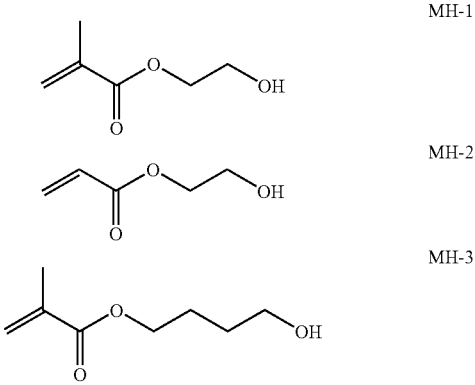

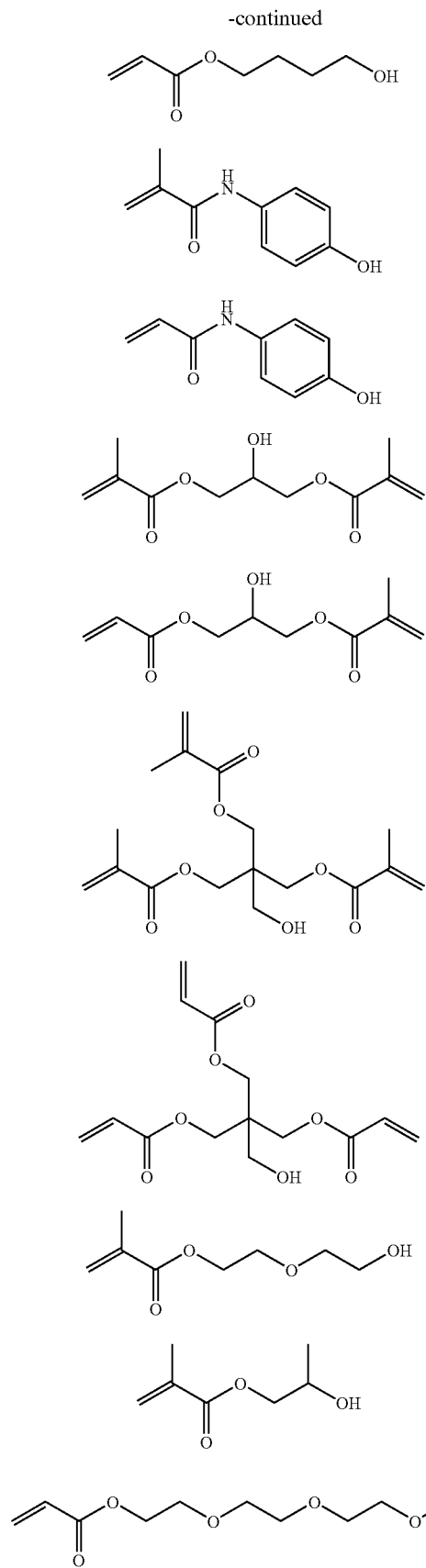

Preferred examples thereof include 2-hydroxyethyl methacrylate, 2-hydroxyethyl acrylate, 4-hydroxybutyl acrylate, 2-hydroxypropylene-1,3-dimethacrylate, and 2-hydroxypropylene-1-methacrylate-3-acrylate.

The reaction product above can be synthesized according to the same method as a conventional method in which a urethaneacrylate compound is ordinarily synthesized employing an ordinary diol, a diisocyanate and an acrylate having a hydroxyl group.

Examples of the reaction product of a polyhydric alcohol having a tertiary amino group in the molecule, a diisocyanate and a compound having a hydroxyl group and an addition polymerizable ethylenically double bond in the molecule will be listed below.

M-1: A reaction product of triethanolamine/hexane-1,6-diisocyanate (3 moles)/2-hydroxyethyl methacrylate (1/3/3 by mole)

M-2: A reaction product of triethanolamine/isophorone diisocyanate/2-hydroxyethyl methacrylate (1/3/3 by mole)

M-3: A reaction product of N-butyldiethanolamine/1,3-bis(1-cyanato-1-methylethyl)benzene/2-hydroxypropylene-1-methacrylate-3-acrylate (1/2/2 by mole)

M-4: A reaction product of N-butyldiethanolamine/1,3-di(cyanatomethyl)benzene/2-hydroxypropylene-1-methacrylate-3-acrylate (1/2/2 by mole)

M-5: A reaction product of N-methydiethanolamine/tolylene-2,4-diisocyanate/2-hydroxypropylene-1,3-dimethacrylate (1/2/2 by mole)

In addition to the above, acrylates or methacrylates disclosed in Japanese Patent O.P.I. Publication Nos. 1-105238 and 2-127404 can be used.

The ethylenically unsaturated compound content of the photopolymerizable composition of the invention is preferably from 20 to 70% by weight, and more preferably from 30 to 60% by weight.

The photopolymerization composition of the invention contains an ethylenically unsaturated monomer, a photopolymerization initiator, a sensitizing dye of formula (A), and a polymer binder. As the polymer binder can be used a polyacrylate resin, a polyvinylbutyral resin, a polyurethane resin, a polyamide resin, a polyester resin, an epoxy resin, a phenol resin, a polycarbonate resin, a polyvinyl butyral resin, a polyvinyl formal resin, a shellac resin, or another natural resin. These resins can be used as an admixture of two or more thereof. The polymer binder is preferably a vinyl copolymer obtained by copolymerization of an acryl monomer.

The polymer binder is more preferably a vinyl copolymer obtained by copolymerization of an acryl monomer, and more preferably a copolymer containing (a) a carboxyl group-containing monomer unit and (b) an alkyl methacrylate or alkyl acrylate unit as the copolymerization component.

Examples of the carboxyl group-containing monomer include an α,β-unsaturated carboxylic acid, for example, acrylic acid, methacrylic acid, maleic acid, maleic anhydride, itaconic acid, itaconic anhydride or a carboxylic acid such as a half ester of phthalic acid with 2-hydroxymethacrylic acid.

Examples of the alkyl methacrylate or alkyl acrylate include an unsubstituted alkyl ester such as methylmethacrylate, ethylmethacrylate, propylmethacrylate, butylmethacrylate, amylmethacrylate, hexylmethacrylate, heptylmethacrylate, octylmethacrylate, nonylmethacrylate, decylmethacrylate, undecylmethacrylate, dodecylmethacrylate, methylacrylate, ethylacrylate, propylacrylate, butylacrylate, amylacrylate, hexylacrylate, heptylacrylate, octylacrylate, nonylacrylate, decylacrylate, undecylacrylate, or dodecylacrylate; a cyclic alkyl ester such as cyclohexyl methacrylate or cyclohexyl acrylate; and a substituted alkyl ester such as benzyl methacrylate, 2-chloroethyl methacrylate, N,N-dimethylaminoethyl methacrylate, glycidyl methacrylate, benzyl acrylate, 2-chloroethyl acrylate, N,N-dimethylaminoethyl acrylate or glycidyl acrylate.

The polymer binder in the invention can further contain, as another co-monomer unit, a monomer unit derived from the monomer described in the following items (1) through (14):

(1) A monomer having an aromatic hydroxy group, for example, o-, (p- or m-)hydroxystyrene, or o-, (p- or m-)hydroxyphenylacrylate;

(2) A monomer having an aliphatic hydroxy group, for example, 2-hydroxyethyl acrylate, 2-hydroxyethyl methacrylate, N-methylolacrylamide, N-methylolmethacrylamide, 4-hydroxybutyl acrylate, 4-hydroxybutyl methacrylate, 5-hydroxypentyl acrylate, 5-hydroxypentyl methacrylate, 6-hydroxyhexyl acrylate, 6-hydroxyhexyl methacrylate, N-(2-hydroxyethyl)acrylamide, N-(2-hydroxyethyl)methacrylamide, or hydroxyethyl vinyl ether;

(3) A monomer having an aminosulfonyl group, for example, m- or p-aminosulfonylphenyl methacrylate, m- or p-aminosulfonylphenyl acrylate, N-(p-aminosulfonylphenyl)methacrylamide, or N-(p-aminosulfonylphenyl)acrylamide;

(4) A monomer having a sulfonamido group, for example, N-(p-toluenesulfonyl)acrylamide, or N-(p-toluenesulfonyl)methacrylamide;

(5) An acrylamide or methacrylamide, for example, acrylamide, methacrylamide, N-ethylacrylamide, N-hexylacrylamide, N-cyclohexylacrylamide, N-phenylacrylamide, N-nitrophenylacrylamide, N-ethyl-N-phenylacrylamide, N-4-hydroxyphenylacrylamide, or N-4-hydroxyphenylmethacrylamide;

(6) A monomer having a fluorinated alkyl group, for example, trifluoromethyl acrylate, trifluoromethyl methacrylate, tetrafluoropropyl methacrylate, hexafluoropropyl methacrylate, octafluoropentyl acrylate, octafluoropentyl methacrylate, heptadecafluorodecyl methacrylate, heptadecafluorodecyl methacrylate, or N-butyl-N-(2-acryloxyethyl)heptadecafluorooctylsulfonamide;

(7) A vinyl ether, for example, ethyl vinyl ether, 2-chloroethyl vinyl ether, propyl vinyl ether, butyl vinyl ether, octyl vinyl ether, or phenyl vinyl ether;

(8) A vinyl ester, for example, vinyl acetate, vinyl chloroacetate, vinyl butyrate, or vinyl benzoate;

(9) A styrene, for example, styrene, methylstyrene, or chloromethystyrene;

(10) A vinyl ketone, for example, methyl vinyl ketone, ethyl vinyl ketone, propyl vinyl ketone, or phenyl vinyl ketone;

(11) An olefin, for example, ethylene, propylene, isobutylene, butadiene, or isoprene;

(12) N-vinylpyrrolidone, N-vinylcarbazole, or N-vinylpyridine,

(13) A monomer having a cyano group, for example, acrylonitrile, methacrylonitrile, 2-pentenenitrile, 2-methyl-3-butene nitrile, 2-cyanoethyl acrylate, or o-, m- or p-cyanostyrene;

(14) A monomer having an amino group, for example, N,N-diethylaminoethyl methacrylate, N,N-dimethylaminoethyl acrylate, N,N-dimethylaminoethyl methacrylate, polybutadiene urethane acrylate, N,N-dimethylaminopropyl acrylamide, N,N-dimethylacrylamide, acryloylmorpholine, N-isopropylacrylamide, or N,N-diethylacrylamide.

Further, another monomer may be copolymerized with the above monomer.

As the polymer binder is also preferred an unsaturated bond-containing copolymer which is obtained by reacting a carboxyl group contained in the above vinyl copolymer molecule with for example, a compound having a (meth)acryloyl group and an epoxy group. Examples of the compound having a (meth)acryloyl group and an epoxy group in the molecule include glycidyl acrylate, glycidyl methacrylate and an epoxy group-containing unsaturated compound disclosed in Japanese Patent O.P.I. Publication No. 11-27196.

The polymer binder has a weight average molecular weight of preferably from 10,000 to 200,000, measured according to gel permeation chromatography (GPC), but the weight average molecular weight is not limited thereto.

The polymer binder content of the photopolymerizable composition of the invention is preferably from 10 to 90% by weight, more preferably from 15 to 70% by weight, and still more preferably from 20 to 50% by weight, based on the solid components in the photopolymerizable composition, in view of sensitivity.

The light sensitive planographic printing plate material of the invention is obtained by coating on a support a light sensitive layer coating liquid comprising the photopolymerizable composition described above to form a light sensitive layer. Solvents used in the light sensitive layer coating liquid include an alcohol such as sec-butanol, isobutanol, n-hexanol, or benzyl alcohol; a polyhydric alcohol such as diethylene glycol, triethylene glycol, tetraethylene glycol, or 1,5-pentanediol; an ether such as propylene glycol monobutyl ether, dipropylene glycol monomethyl ether, or tripropylene glycol monomethyl ether; a ketone such as diacetone alcohol, methyl ethyl ketone, cyclohexanone, or methyl cyclohexanone; and an ester such as ethyl lactate, butyl lactate, diethyl oxalate, or methyl benzoate.

The coating liquid is coated on a support according to a conventional method, and dried to obtain a light sensitive planographic printing plate material. Examples of the coating method include an air doctor coating method, a blade coating method, a wire bar coating method, a knife coating method, a dip coating method, a reverse roll coating method, a gravure coating method, a cast coating method, a curtain coating method, and an extrusion coating method.

The drying temperature of the coated light sensitive layer is preferably from 60 to 160° C., more preferably from 80 to 140° C., and still more preferably from 90 to 120° C.

Further, the polymer binder used in the invention has an acid value of preferably from 10 to 90, more preferably from 30 to 120, and most preferably from 50 to 90. Such a polymer provides a light sensitive layer comprised of the photopolymerizable composition in which polarity balance is maintained and a coating solution for the light sensitive layer preventing pigment from coagulating.

The support used in the light sensitive planographic printing plate material of the invention is a plate or a sheet capable of carrying the light sensitive layer and preferably has a hydrophilic surface on the side on which the light sensitive layer is to be provided.

As the supports used in the invention, a plate of a metal such as aluminum, stainless steel, chromium or nickel, or a plastic film such as a polyester film, a polyethylene film or a polypropylene film, which is deposited or laminated with the above-described metal can be used. Further, a polyester film, a polyvinyl chloride film or a nylon film whose surface is subjected to hydrophilization treatment can be used. Among the above, the aluminum plate is preferably used, and may be a pure aluminum plate or an aluminum alloy plate.

As the aluminum alloy, there can be used various ones including an alloy of aluminum and a metal such as silicon, copper, manganese, magnesium, chromium, zinc, lead, bismuth, nickel, titanium, sodium or iron. In the aluminum plate for the support, the surface is roughened for water retention.

It is preferable that the support in the invention is subjected to degreasing treatment for removing rolling oil prior to surface roughening (graining). The degreasing treatments include degreasing treatment employing solvents such as trichlene and thinner, and an emulsion degreasing treatment employing an emulsion such as kerosene or triethanol. It is also possible to use an aqueous alkali solution such as caustic soda for the degreasing treatment. When an aqueous alkali solution such as caustic soda is used for the degreasing treatment, it is possible to remove soils and an oxidized film which can not be removed by the above-mentioned degreasing treatment alone. When an aqueous alkali solution such as caustic soda is used for the degreasing treatment, the resulting support is preferably subjected to desmut treatment in an aqueous solution of an acid such as phosphoric acid, nitric acid, sulfuric acid, chromic acid, or a mixture thereof, since smut is produced on the surface of the support. The surface roughening methods include a mechanical surface roughening method and an electrolytic surface roughening method electrolytically etching the support surface.

Though there is no restriction for the mechanical surface roughening method, a brushing roughening method and a honing roughening method are preferable.

Though there is no restriction for the electrolytic surface roughening method, a method, in which the support is electrolytically surface roughened in an acidic electrolytic solution, is preferred.

After the support has been electrolytically surface roughened, it is preferably dipped in an acid or an aqueous alkali solution in order to remove aluminum dust, etc. produced in the surface of the support. Examples of the acid include sulfuric acid, persulfuric acid, hydrofluoric acid, phosphoric acid, nitric acid and hydrochloric acid, and examples of the alkali include sodium hydroxide and potassium hydroxide. Among those mentioned above, the aqueous alkali solution is preferably used. The dissolution amount of aluminum in the support surface is preferably 0.5 to 5 g/m². After the support has been dipped in the aqueous alkali solution, it is preferable for the support to be dipped in an acid such as phosphoric acid, nitric acid, sulfuric acid and chromic acid, or in a mixed acid thereof, for neutralization.

The mechanical surface roughening and electrolytic surface roughening may be carried out singly, and the mechanical surface roughening followed by the electrolytic surface roughening may be carried out.

After the surface roughening, anodizing treatment may be carried out. There is no restriction in particular for the method of anodizing treatment used in the invention, and known methods can be used. The anodizing treatment forms an anodization film on the surface of the support.

The support which has been subjected to anodizing treatment is optionally subjected to sealing treatment. For the sealing treatment, it is possible to use known methods using hot water, boiling water, steam, a sodium silicate solution, an aqueous dicromate solution, a nitrite solution and an ammonium acetate solution.

After the above treatment, the support is suitably undercoated with a water soluble resin such as polyvinyl phosphonic acid, a polymer or copolymer having a sulfonic acid in the side chain, or polyacrylic acid; a water soluble metal salt such as zinc borate; a yellow dye; an amine salt; and so on, for hydrophilization treatment. The sol-gel treatment support disclosed in Japanese Patent O.P.I. Publication No. 5-304358, which has a functional group capable of causing addition reaction by radicals as a covalent bond, is suitably used.

EXAMPLES

Next, the present invention will be explained in the following examples, but the present invention is not limited thereto. In the examples, "parts" represents "parts by weight", unless otherwise specified.

<Synthesis of Acryl Copolymer 1>

Thirty parts of methacrylic acid, 50 parts of methyl methacrylate, 20 parts of ethyl methacrylate, 500 parts of isopropyl alcohol, and 3 parts of $\alpha,\alpha'$-azobisisobutyro-nitrile were put in a three neck flask under nitrogen atmosphere, and reacted under nitrogen atmosphere for 6 hours at 80° C. in an oil bath. After that, the reaction mixture was refluxed at a boiling point of isopropyl alcohol for one hour, and 3 parts of triethylbenzylammonium chloride and 25 parts of glycidyl methacrylate were further added to the mixture, and reacted for additional 3 hours. Thus, acryl copolymer 1 was obtained. The weight average molecular weight of the acryl copolymer 1 was 35,000, measured according to GPC. The glass transition temperature Tg of the acryl copolymer 1 was 85° C., measured according to DSC (differential thermal analysis).

<Preparation of Support>

A 0.3 mm thick aluminum plate (material 1050, refining H16) was degreased at 60° C. for one minute in a 5% sodium hydroxide solution, washed with water, immersed at 25° C. for one minute in 10% hydrochloric acid solution to neutralize, and then washed with water. The resulting aluminum plate was electrolytically etched using an alternating current at 25° C. for 60 seconds at a current density of 100 A/dm² in an aqueous 0.3% nitric acid solution, and desmut at 60° C. for 10 seconds in a 5% sodium hydroxide solution. The desmut aluminum plate was anodized at 25° C. for 1 minute at a current density of 10 A/dm² and at a voltage of 15 V in a 15% sulfuric acid solution, and further subjected to hydrophilization treatment at 75° C. in an aqueous 1% polyvinyl phosphonic acid solution. Thus, support was obtained.

The center line average surface roughness (Ra) of the support was 0.65 μm.

<Preparation of Planographic Printing Plate Material Sample>

The following photopolymerizable light sensitive layer coating solution 1 was coated on the support above through a wire bar, and dried at 95° C. for 1.5 minutes to give a light sensitive layer having a dry thickness of 2.0 g/m².

| (Photopolymerizable light sensitive layer coating solution 1) | |
|---|---|
| Acryl copolymer 1 | 40 parts |
| Addition-polymerizable ethylenically unsaturated monomer (as shown in Table 1) | amount as shown in Table 1 |

-continued

| (Photopolymerizable light sensitive layer coating solution 1) | |
|---|---|
| Photopolymerization initiator (as shown in Table 1) | amount as shown in Table 1 |
| Sensitizing dye (as shown in Table 1) | amount as shown in Table 1 |
| N-Phenylglycin benzyl ester | 4.0 parts |
| Phthalocyanine pigment (MHI 454 produced by Mikuni Sikisosha) | 6.0 parts |
| 2-t-Butyl-6-(3-t-butyl-2-hydroxy-5-methylbenzyl)-4-methylphenylacrylate (Sumirizer GS: produced by Sumitomo 3M Co., Ltd.) | 0.5 parts |
| Fluorine-contained surfactant (F-178K: produced by Dainippon Ink Co., Ltd.) | 0.5 parts |
| Methyl ethyl ketone | 80 parts |
| Cyclohexanone | 820 parts |

Subsequently, the following oxygen-shielding layer coating solution 1 was coated on the resulting light sensitive layer through an applicator, and dried at 75° C. for 1.5 minutes to give an oxygen-shielding layer. Thus, planographic printing plate material samples 1 through 15 were prepared.

| (Oxygen-shielding layer coating solution 1) | |
|---|---|
| Polyvinyl alcohol, GL-05 (produced by Nippon Gosei Kagaku Co., Ltd.) | 89 parts |
| Water-soluble polyamide P-70 (produced by Toray Co., Ltd.) | 10 parts |
| Surfactant Surfinol 465 (produced by Nisshin Kagaku Kogyo Co., Ltd.) | 0.5 parts |
| Water | 900 parts |

<Preparation and Evaluation of Planographic Printing Plate Sample>

Each of the planographic printing plate samples obtained above was imagewise exposed at a resolving degree of 2400 dpi, employing a modified plate setter of a plate setter Tiger Cat (produced by ECRM Co., Ltd.) equipped with a laser with an output power of 30 mW emitting light with a wavelength of 408 nm. Herein, dpi represents the dot numbers per 2.54 cm.

An original image used for exposure had a solid image and a 50% square dot image with a screen line number of 175 LPI (line per inch). Subsequently, the exposed sample was subjected to development treatment employing a CTP automatic developing machine (PHW 32-V produced by Technigraph Co., Ltd.) to obtain a planographic printing plate sample. Herein, the developing machine comprised a preheating section for preheating the exposed sample, a pre-washing section for removing the protective layer before development, a development section charged with developer having the following developer composition, a washing section for removing the developer remaining on the developed sample after development, and a gumming section charged with a gumming solution (a solution obtained by diluting GW-3, produced by Mitsubishi Chemical Co., Ltd., with water by a factor of 2) for protecting the surface of the developed sample. Herein, preheating was carried out at 105° C. for 10 seconds. Thus, planographic printing plate samples were obtained.

| <Composition of developer> | |
|---|---|
| Potassium silicate A (an aqueous potassium silicate solution containing 25.5-27.5% by weight of SiO$_2$ and 12.5-14.5% by weight of K$_2$O) | 8.0 parts |
| NEWCOL B-13SN (produced by Nippon Nyukazai Co., Ltd.) | 3.0 parts |
| Potassium hydroxide | Amount giving pH 12.3 |

<<Sensitivity>>

The lowest exposure energy (μJ/cm2), at which no layer reduction was observed at the solid image portions of the printing plate sample, was evaluated as a measure of sensitivity. The less the exposure energy is, the higher the sensitivity.

<<Storage Stability>>

The planographic printing plate material sample obtained above was stored at 55° C. and 20% RH for three days, and then was evaluated for sensitivity in the same manner as described above.

<<Printing Durability>>

The planographic printing plate material sample was exposed at 200 μJ/cm$^2$ and developed to prepare a planographic printing plate sample with a 175 line image. Subsequently, the resulting printing plate sample was mounted on a press (DAIYA1F-1 produced by Mitsubishi Jukogyo Co., Ltd.), and printing was carried out wherein coated paper, printing ink (Soybean oil ink, "Naturalith 100" produced by Dainippon Ink Kagaku Co., Ltd.), and dampening water (SG-51, H solution produced by Tokyo Ink Co., Ltd., Concentration: 1.5%) were used. The number (lowest) of prints printed from when printing started till when dot area reduction of dots at highlight portions was observed was evaluated as a measure of printing durability. The more the number are, the higher the printing durability.

The results are shown in Table 1.

TABLE 1

| Sample No. | Ethylenically unsaturated monomer (parts) | Photopolymerization initiator (parts) | Sensitizing dye (parts) | Exposure energy (μJ/cm$^2$) | Exposure energy after 3 days' storage at 55° C. and 20% RH (μJ/cm$^2$) | Printing durability (Number) |
|---|---|---|---|---|---|---|
| 1 (Inv.) | M-3 (25) *N (15) | I-1 (5) | A04 (4) | 65 | 70 | 160,000 |
| 2 (Inv.) | M-3 (25) *N (15) | I-1 (5) | A08 (4) | 45 | 45 | 180,000 |
| 3 (Inv.) | M-3 (25) *N (15) | I-1 (5) | A26 (4) | 35 | 35 | 200,000 |
| 4 (Inv.) | M-3 (25) *N (15) | I-1 (5) | A28 (4) | 40 | 40 | 170,000 |
| 5 (Inv.) | M-3 (25) *N (15) | I-1 (5) | A47 (4) | 40 | 50 | 190,000 |
| 6 (Inv.) | M-3 (25) *N (15) | I-2 (5) | A06 (4) | 60 | 65 | 100,000 |
| 7 (Inv.) | M-3 (25) *N (15) | I-2 (5) | A24 (4) | 60 | 65 | 100,000 |
| 8 (Inv.) | M-3 (25) *N (15) | I-2 (5) | A35 (4) | 50 | 50 | 120,000 |
| 9 (Inv.) | M-3 (25) *N (15) | I-2 (5) | A44 (4) | 45 | 45 | 120,000 |

TABLE 1-continued

| Sample No. | Ethylenically unsaturated monomer (parts) | Photopolymerization initiator (parts) | Sensitizing dye (parts) | Exposure energy (μJ/cm²) | Exposure energy after 3 days' storage at 55° C. and 20% RH (μJ/cm²) | Printing durability (Number) |
|---|---|---|---|---|---|---|
| 10 (Inv.) | M-3 (25) *N (15) | I-3 (5) | A05 (4) | 90 | 100 | 60,000 |
| 11 (Inv.) | M-3 (25) *N (15) | I-3 (5) | A10 (4) | 75 | 80 | 80,000 |
| 12 (Inv.) | M-3 (25) *N (15) | I-3 (5) | A22 (4) | 70 | 75 | 90,000 |
| 13 (Comp.) | M-3 (25) *N (15) | I-1 (5) | D-1 (4) | 110 | 120 | 100,000 |
| 14 (Comp.) | M-3 (25) *N (15) | I-2 (5) | D-1 (4) | 120 | 135 | 70,000 |
| 15 (Comp.) | M-3 (25) *N (15) | I-3 (5) | D-1 (4) | 150 | 170 | 30,000 |

Inv.: Inventive,

Comp.: Comparative

*N: NK ESTER 4G (polyethylene glycol dimethacrylate produced by Shinnakamura Kagaku Co., Ltd.)

D-1

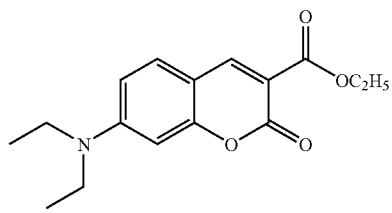

I-1

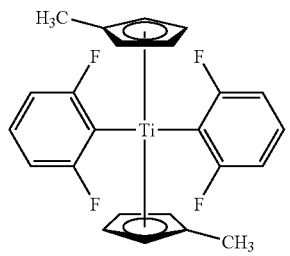

I-2

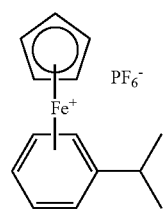

I-3

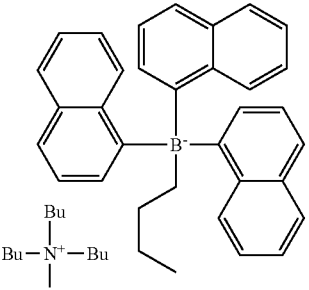

As is apparent from table 1 above, the inventive planographic printing plate material samples provide high storage stability and high sensitivity, and the planographic printing plate samples obtained from the inventive planographic printing plate material samples provide high printing durability.

What is claimed is:

1. A photopolymerizable composition containing an addition-polymerizable ethylenically unsaturated compound, a photopolymerization initiator, a polymer binder, and a sensitizing dye having a coumarin nucleus represented by the following formula (A), Formula (A)

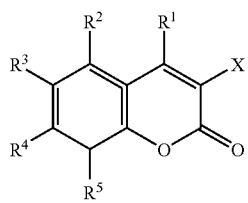

wherein $R^1$, $R^2$, $R^3$, $R^4$, and $R^5$ independently represent a hydrogen atom or a substituent; and X represents a substituted or unsubstituted 6-member aromatic ring group having a first atom combining with the coumarin nucleus and two second atoms positioned adjacent to the first atom, wherein at least one of the two second atoms is a nitrogen atom, provided that the aromatic ring may form a condensed ring together with another ring.

2. The photopolymerizable composition of claim 1, wherein $R^4$ in formula (A) represents a dialkylamino group.

3. The photopolymerizable composition of claim 1, wherein the photopolymerization initiator is an iron arene complex or a titanocene compound.

4. A light sensitive planographic printing plate material comprising a support, and provided thereon, a photopolymerizable light sensitive layer comprising the photopolymerizable composition of claim 1.

5. A process of manufacturing a planographic printing plate comprising the step of: imagewise scanning-exposing the light sensitive planographic printing plate material of claim 4 to laser beams with a wavelength of from 350 to 450 nm.

* * * * *